United States Patent [19]

Kuo

[11] Patent Number: 6,025,249
[45] Date of Patent: Feb. 15, 2000

[54] METHOD FOR MANUFACTURING SHALLOW TRENCH ISOLATION STRUCTURE

[75] Inventor: Chien-Li Kuo, Hsinchu Hsien, Taiwan

[73] Assignee: United Microelectronics Corp., Taiwan

[21] Appl. No.: 08/968,235

[22] Filed: Nov. 12, 1997

[30] Foreign Application Priority Data

Sep. 10, 1997 [TW] Taiwan ................................ 86113087

[51] Int. Cl.⁷ .............................................. H01L 21/762
[52] U.S. Cl. ............................................ 438/426; 438/424
[58] Field of Search .................................... 438/424, 426, 438/FOR 227

[56] References Cited

U.S. PATENT DOCUMENTS 5,521,422   5/1996   Mandelman et al. .
5,677,233  10/1997   Abiko .
5,801,083   9/1998   Yu et al. .
5,834,358  11/1998   Pan et al. .

*Primary Examiner*—George Fourson
*Attorney, Agent, or Firm*—Rabin & Champagne, PC

[57] ABSTRACT

A method for manufacturing a shallow trench isolation structure comprising the steps of forming a masking layer over a substrate; then, patterning the masking layer to form an opening; thereafter, forming an oxide layer over the surface of the masking layer and the opening; and, etching back the oxide layer to form oxide spacers on the sidewalls of the masking layer. Subsequently, the substrate is etched downward along the side edges of the oxide spacers to form a trench. Thereafter, the oxide spacers are removed to expose the substrate surface formerly blocked by the oxide spacers. Finally, a liner oxide layer is formed on the trench surface over the substrate. The characteristic of this invention is the formation of a smoother and thicker liner oxide layer. Hence, device current leakage due to subthreshold current and associated kink effect can be avoided.

20 Claims, 5 Drawing Sheets

METHOD FOR MANUFACTURING SHALLOW TRENCH ISOLATION STRUCTURE

BACKGROUND OF THE INVENTION

1. Field of Invention

The present invention relates to a manufacturing process for semiconductors. More particularly, the present invention relates to a method for manufacturing a shallow trench isolation (STI) structure.

2. Description of Related Art

A complete integrated circuit is generally made from tens of thousands of transistors. To prevent the short-circuiting of any two neighboring transistors, an insulating layer is normally formed between the transistors for isolating the devices. For example, a shallow trench isolation is formed by etching a trench and then filling the trench with an insulating, material to define an active device area.

FIGS. 1A through 1C are cross-sections showing the progression of manufacturing steps in the production of a conventional shallow trench isolation. First, as shown in FIG. 1A, a substrate 10 is provided. Then, a pad oxide layer 11 is formed over the substrate 10 using a thermal oxidation process. The pad oxide layer can be, for example, a silicon dioxide layer. Thereafter, a silicon nitride layer 12 ($Si_3N_4$) is formed over the pad oxide layer 11 using a low pressure chemical vapor deposition (LPCVD) method.

Next, as shown in FIG. 2B, a photoresist layer 13 is formed over the silicon nitride layer 12, and then a photolithographic process is used to form a pattern on the silicon nitride layer 12. Then, the silicon nitride layer 12 is anisotropically etched to expose portions of the pad oxide layer using a dry etching method. Similarly, using a photoresist layer 13 and photolithographic processing again, a pattern is formed on the pad oxide layer 11 and the substrate 10. Then, the exposed pad oxide layer 11 is anisotropically etched by a dry etching method. Etching continues down into the substrate 10, and finally forming a trench 18 having interior surfaces 15 that exposes portions of the substrate 10.

Next, as shown in FIG. 1C, the photoresist layer 13 is removed to expose the silicon nitride layer 12. Then, a liner oxide layer 16 is formed at a high temperature using a thermal oxidation process. The liner oxide layer 16 covers the interior surfaces 15 of the trench 14, and has connection with the pad oxide layer 11 at the top upper corner of the trench 14.

FIG. 2 is a magnified view showing the features at the corner within the dash circle of FIG. 1C. As shown in FIG. 2, a sharp edge near the end of the liner oxide layer is formed at the top upper corner, that is, at the junction between the substrate 10 and the pad oxide layer 11.

Finally, conventional processes are performed to complete the structural formation of a shallow trench isolation. For example, the trench is filled using an insulating material such as silicon dioxide. Other subsequent processes are known to those skilled in the art, therefore a detailed description is omitted here.

In the conventional method, the thickness of both the liner oxide layer and the pad oxide layer is roughly the same. Therefore, due to the over-exposure of the substrate at the upper corner of the trench in a subsequent pad oxide layer removing process, a kink effect is generated at the upper corner location. Hence, besides generating sub-threshold current in the device, a corner parasitic MOSFET will also be formed, leading to substantial current leakage in the device.

Furthermore, in the conventional method, the upper corner is the place where a junction between the substrate and the pad oxide layer is formed. Because the junction is above the upper trench corner, the exposed surface of the substrate is very small. This will lead to the formation of a very thin gate oxide layer in subsequent process. A thin gate oxide layer not only will lower the reliability of the gate, but also will increase the electric field strength at the upper trench corner due to a charge accumulation there. This has the effect of worsening the parasitic device problem even more.

In light of the foregoing, there is a need in the art to improve the structure and manufacturing method of a shallow trench isolation.

SUMMARY OF THE INVENTION

Accordingly, the present invention is directed to a method for manufacturing a shallow trench isolation structure that exposes more substrate at the upper trench corners such that a smoother and thicker pad oxide layer can be obtained through subsequent processes. This serves to minimize the kink effect in a conventional technique, and reduces device current leakage due to the subthreshold current and the existence of a parasitic device. Hence, the overall efficiency of the device is improved.

To achieve these and other advantages and in accordance with the purpose of the invention, as embodied and broadly described herein, the invention provides a method for manufacturing a shallow trench isolation structure. The method comprises the steps of forming a pad oxide layer over a substrate using a thermal oxidation process; then, forming a silicon nitride layer over the pad oxide layer using a low pressure chemical vapor deposition method. Thereafter, the silicon nitride layer and the pad oxide layer are patterned using conventional photolithographic and etching processes. The patterned silicon nitride layer and the pad oxide layer are later used as a mask for subsequent photolithographic and etching processes. Then, an oxide layer is formed over the mask. This is followed by an etching back to form oxide spacers on the sidewalls of the mask. Subsequently, the substrate is etched along the side edges of the oxide spacers to form a trench. The trench exposes the interior surfaces of the substrate. Finally, the oxide spacers are removed and then a liner oxide layer is formed on the interior surfaces of the trench. The method of removing the oxide spacers includes using an isotropic wet etching method, for example, using hydrofluoric acid as a solvent.

The above processes are capable of exposing more of the substrate at the upper trench corners. Therefore, in subsequent processes, a smoother and thicker liner oxide layer can be formed at the upper corners. This serves to prevent the over-exposure of the substrate at the upper corners when the liner oxide layer is removed subsequently. Hence, the problem of current leakage in devices can be avoided.

Another characteristic of this invention is in the removal of spacers using hydrofluoric acid as a solvent in a wet etching process. The process not only can expose more substrate surface at the upper trench corners, but also can form a smoother liner oxide layer there.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
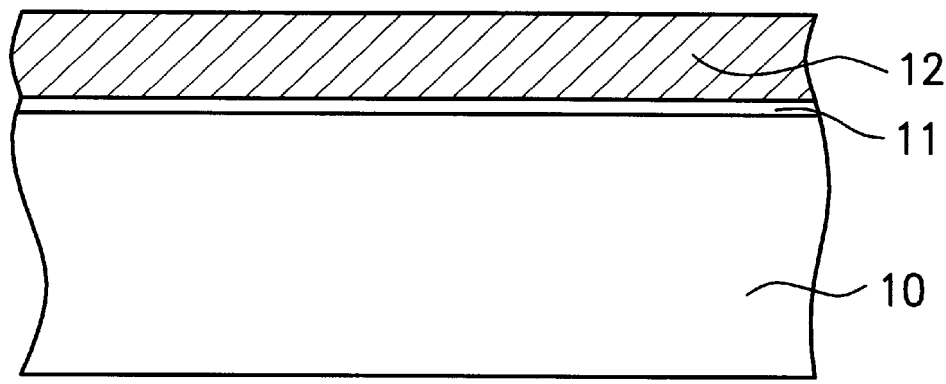
FIGS. 1A through 1C are cross-sections showing the progression of manufacturing steps in the production of a conventional shallow trench isolation.
Figure 1B:
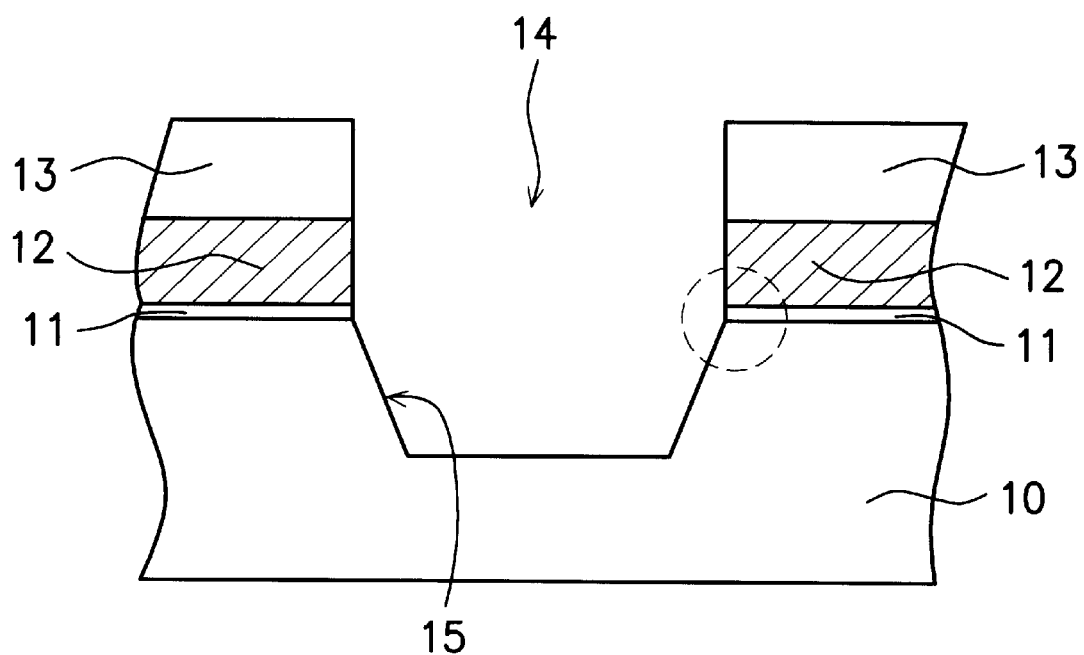
Figure 1C:
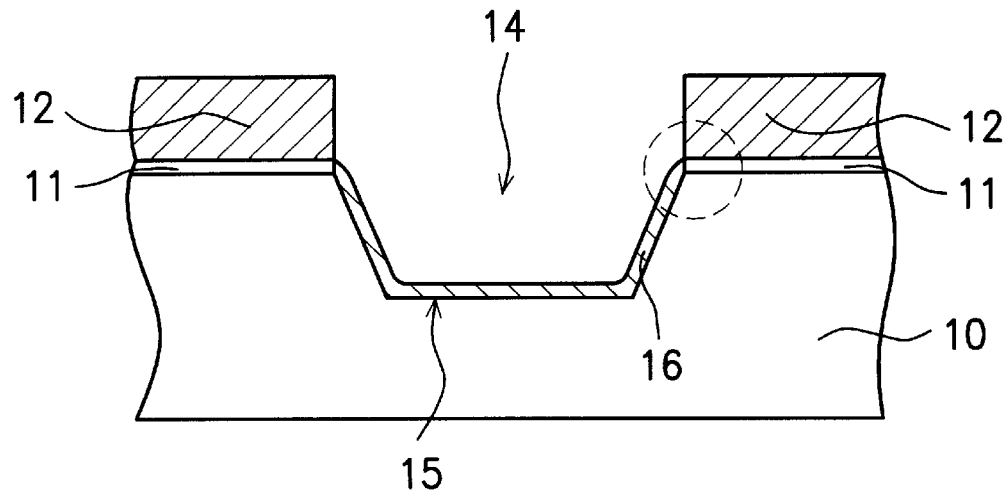
Figure 2:
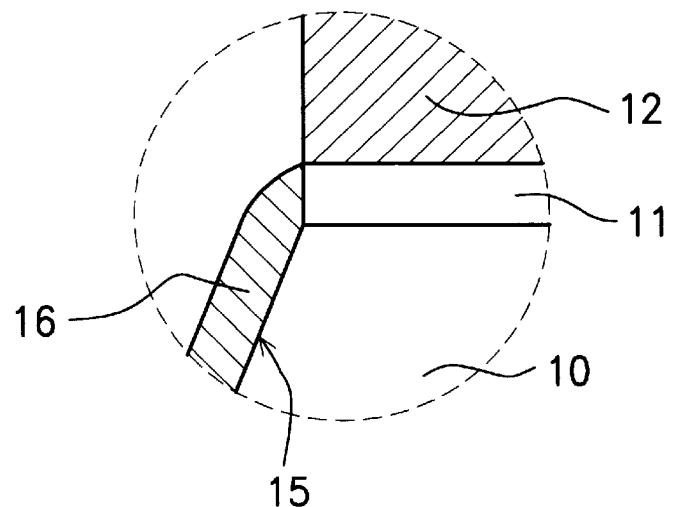
FIG. 2 is a magnified view showing the features at the corner within the dash circle of FIG. 1C.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
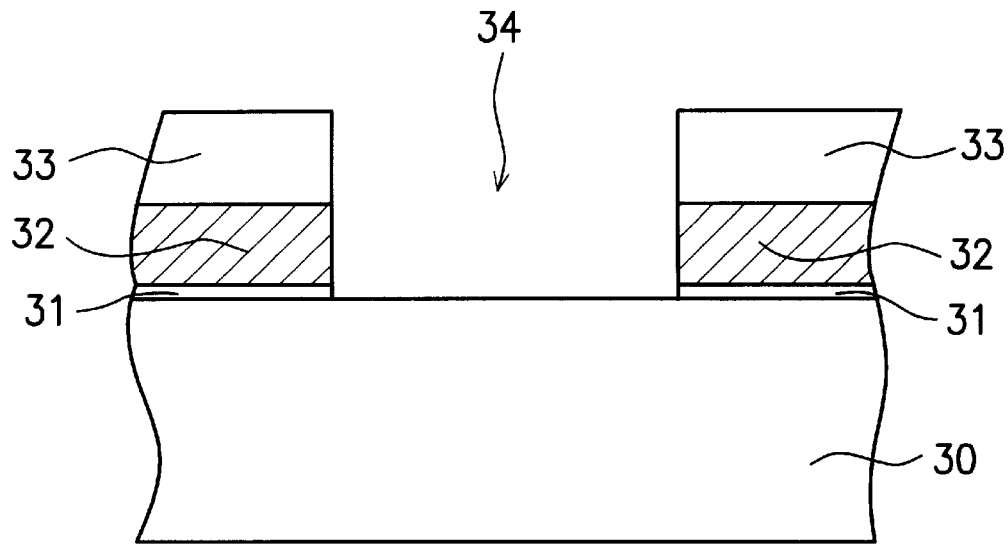
FIGS. 3A through 3D are cross-sections showing the progression of manufacturing steps in the production of a shallow trench isolation according to one preferred embodiment of this invention.

FIGS. 3A through 3D are cross-sections showing the progression of manufacturing steps in the production of a shallow trench isolation according to one preferred embodiment of this invention. First, as shown in FIG. 3A, a substrate 30 is provided. Then, a pad oxide layer 31 is formed over the substrate 30, for example, using a thermal oxidation process. Thereafter, a silicon nitride layer 32 is formed over the pad oxide layer 31 using a low-pressure chemical vapor deposition method. Next, a photoresist layer 33 is formed over the silicon nitride layer 32. Then, the silicon nitride layer 32 and the pad oxide layer 32 are sequentially patterned forming an opening 34 in the silicon nitride layer 32 and the pad oxide layer 31. The method of patterning can be conventional photolithographic and etching processes, wherein the etching step includes using an anisotropic dry etching method, for example, a plasma etching. The patterned pad oxide layer and the silicon nitride layer serve as a masking layer in subsequent photolithographic and etching processes.

Figure 3B:
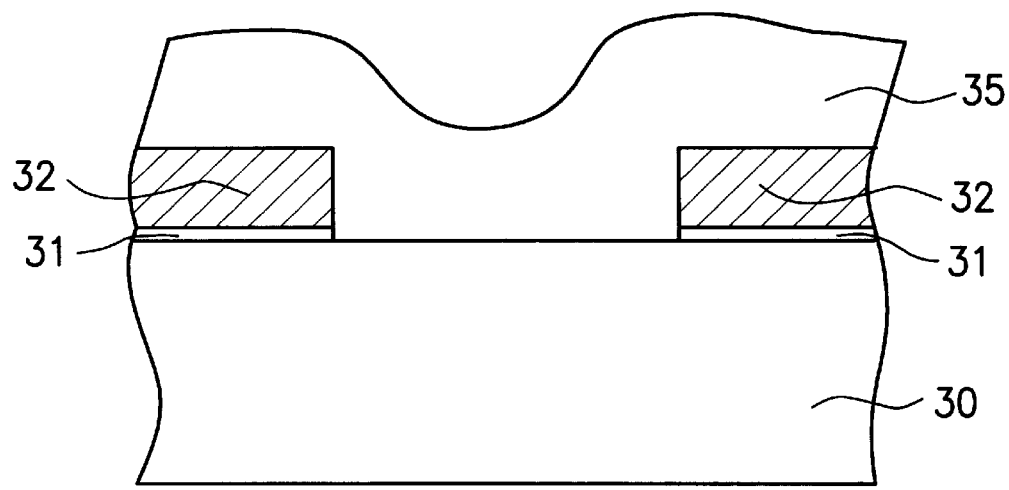
Figure 3C:
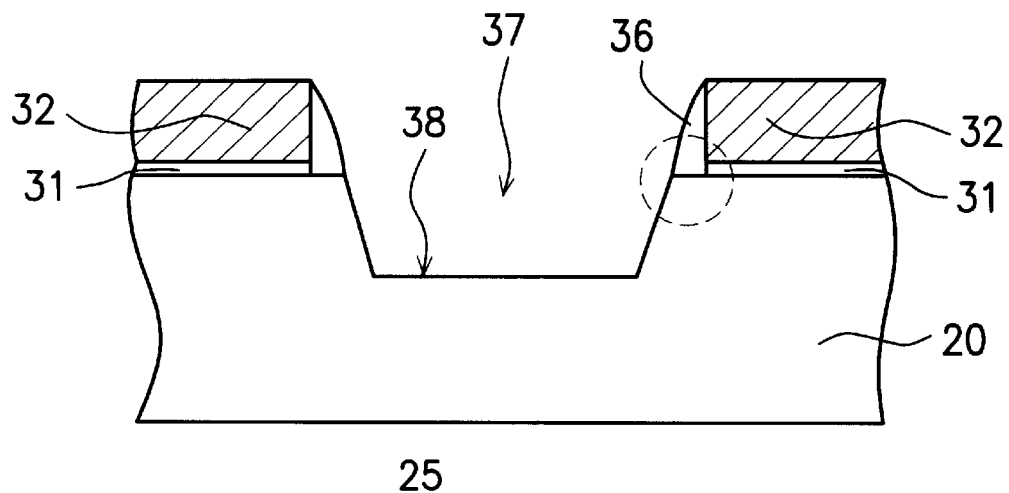

Next, as shown in FIG. 3B, the photoresist layer 33 is removed to expose the silicon nitride layer 32. Then, an oxide layer 35 is formed over the patterned opening 34 using a chemical vapor deposition method. This is followed by etching back the oxide layer 35 to form spacers 36 on the sidewalls of the masking layer as shown in FIG. 3C. Back etching is performed, for example, using an anisotropic dry etching method. The etching operation is continued down the substrate 30 after passing the oxide spacers to form a trench 37 in the substrate 30. The trench 37 also has interior surfaces 38 that expose part of the substrate 30.

Figure 3D:
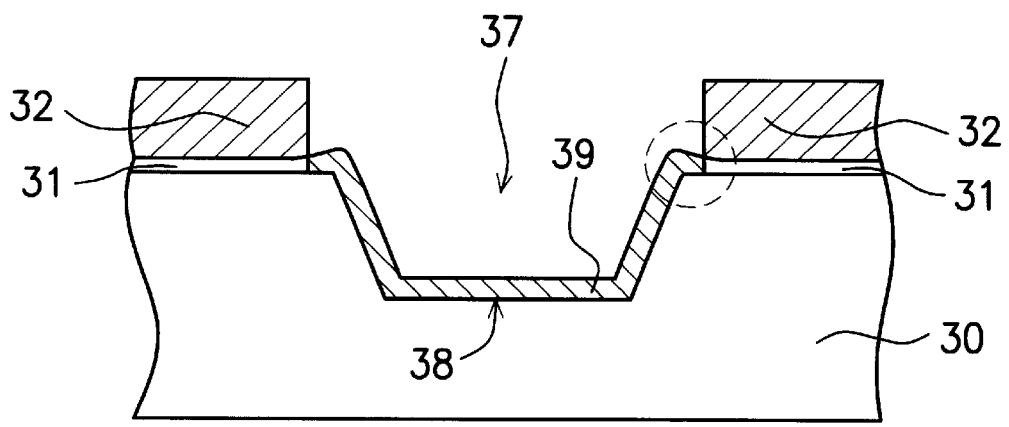
Figure 4:
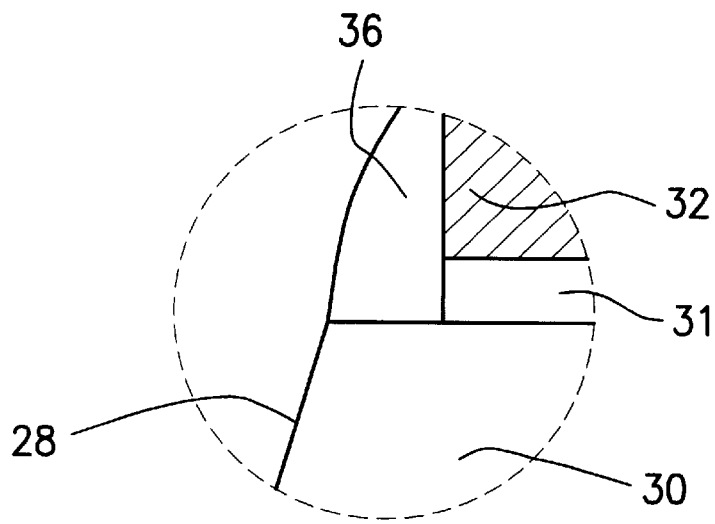
FIG. 4 is a magnified view showing the features at the corner within the dash circle of FIG. 3C.

FIG. 4 is a magnified view showing the features at the corner within the dash circle of FIG. 3C. Since an oxide spacer 36 is formed at the upper trench corner, there is no need for direct contact of the silicon nitride layer 32 and the pad oxide layer 31 with the interior surface 38 of the trench 37. Next, as shown in FIG. 3D, the oxide spacers are removed to expose the substrate 30 originally blocked by the spacers, for example, using an isotropic wet etching method. For example, hydrofluoric acid is used as an etchant in the wet etching method. In the subsequent step, a liner oxide layer 39 is formed at a high temperature using a thermal oxidation process. The liner oxide layer 39 covers the substrate surface originally blocked by the spacers and the interior surfaces 38 of the trench 37. The liner oxide layer 39 is preferably a silicon dioxide layer having a thickness of between 200 Å to 600 Å, which has connection with the pad oxide layer 31.

Figure 5:
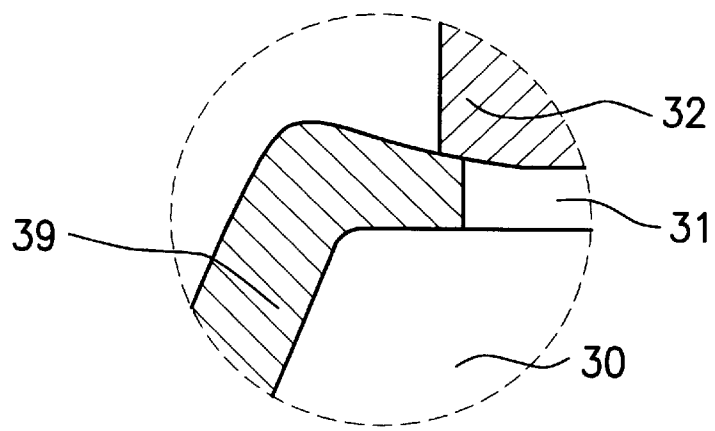
FIG. 5 is a magnified view showing the features at the corner within the dash circle of FIG. 3D.

FIG. 5 is a magnified view showing the features at the corner within the dash circle of FIG. 3D. As shown in FIG. 5, the liner oxide layer 39 formed after the removal of the spacers has a rather smooth transition profile at the upper trench corner near the junction with the pad oxide layer 31.

Finally, conventional processes are performed to complete the structural formation of a shallow trench isolation. For example, the trench 37 is filled by an insulating material such as silicon dioxide. Other subsequent processes are known to those skill in the art, therefore detail description is omitted here.

The first characteristic of this invention is that the thickness of the liner oxide layer 39 at the upper trench corner is smoother and thicker than the pad oxide layer 31 is. Therefore, when the pad oxide layer 31 is subsequently removed, the substrate at the upper corner will not be over-exposed. Hence, the kink effect and the problem of current leaking from the device can be avoided.

The second characteristic of this invention is the use of hydrofluoric acid as an etchant in the wet etching process for the removal of oxide spacers 36. Using hydrofluoric acid, more of the substrate 30 area at the upper corner of the trench 37 is exposed. Hence, a thicker gate oxide layer can be formed in subsequent processes, which may lead to a better gate reliability and a lessening of parasitic device problem.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a shallow trench isolation structure, comprising:

providing a substrate;

forming a masking layer over the substrate;

patterning the masking layer to form an opening exposing the substrate, wherein the opening is formed above the desired shallow trench isolation structure;

forming a spacer on the sidewall of the opening and directly on an upper surface of the substrate;

etching downward along the side edges of the spacers to form a trench, wherein the trench is formed deep into the substrate;

removing the spacers to expose a portion of the upper surface of the substrate; and forming a liner oxide layer over the interior surfaces of the trench and the exposed upper surface of the substrate, the liner oxide layer having an increased thickness at a junction of the exposed upper surface and an adjacent interior surface.

2. The method of claim 1, wherein before the step of forming a masking layer, further includes the step of forming a pad oxide layer over the substrate.

3. The method of claim 2, wherein the step forming the pad oxide layer includes using a thermal oxidation process.

4. The method of claim 1, wherein the step of forming the masking layer includes depositing silicon nitride.

5. The method of claim 4, wherein the step of depositing silicon nitride includes using a low-pressure chemical vapor deposition method.

6. The method of claim 1, wherein the step of patterning the masking layer includes coating a photoresist layer over the masking layer, and then using conventional photolithographic and etching techniques to etch the masking layer so as to expose the substrate.

7. The method of claim 6, wherein the etching step includes using a dry etching method.

8. The method of claim 7, wherein the dry etching step includes using a plasma-etching method.

9. The method of claim 1, wherein after the step of patterning the masking layer, further includes the step of removing the photoresist layer.

10. The method of claim 1, wherein the step of forming spacers further includes the substeps of:

forming an oxide layer over the masking layer and the substrate surface; and etching back the oxide layer to form spacers on the sidewalls of the masking layer.

11. The method of claim 10, wherein the step of etching back the oxide layer includes using a dry etching method.

12. The method of claim 1, wherein the step of etching the substrate includes using an anisotropic dry etching method.

13. The method of claim 1, wherein the step of removing the spacers includes using a wet etching method.

14. The method of claim 13, wherein the step of wet etching includes using hydrofluoric acid as an etchant.

15. The method of claim 1, wherein the step of forming liner oxide layer includes using a thermal oxidation process.

16. The method of claim 1, wherein the liner oxide layer has connection with the pad oxide layer.

17. The method of claim 1, wherein the liner oxide layer has a thickness of about 200 Å to 600 Å.

18. The method of claim 1, wherein the step of forming the spacers includes depositing silicon dioxide.

19. The method of claim 1, wherein the step of forming the liner oxide layer includes depositing a silicon dioxide layer.

20. The method of claim 1, wherein the step of forming the pad oxide layer includes depositing a silicon dioxide layer.

* * * * *